United States Patent

Scholz et al.

[11] Patent Number: 5,945,029
[45] Date of Patent: Aug. 31, 1999

[54] CERAMIC MONOFILAMENT OR MULTIFILAMENT FIBER AND PROCESSES FOR THEIR PRODUCTION AND USE

[75] Inventors: Hermann Scholz, Zell a.M.; Winfried Watzka, Würzburg; Peter Vierhaus, Wörthstrasse, all of Germany

[73] Assignee: Fraunhofer-Gesellschaft zur Forderung der Angewandten Forschung E.V., Munich, Germany

[21] Appl. No.: 08/920,006

[22] Filed: Aug. 29, 1997

[30] Foreign Application Priority Data

Sep. 3, 1996 [DE] Germany ............... 196 35 748

[51] Int. Cl.$^6$ ............... C04B 35/49; C04B 35/493; D01F 9/10
[52] U.S. Cl. ............... 252/62.9 R; 252/62.9 PZ; 501/12; 501/95.1; 501/134; 264/639; 264/637; 264/640; 264/632
[58] Field of Search ............... 264/639, 627, 264/640, 632; 252/62.9 R, 62.9 PZ; 501/95.1, 134, 12

[56] References Cited

U.S. PATENT DOCUMENTS

| | | | |
|---|---|---|---|
| 3,760,049 | 9/1973 | Borer et al. | 264/57 |
| 3,795,524 | 3/1974 | Sowman | 106/65 |
| 4,166,147 | 8/1979 | Lange et al. | 428/328 |
| 4,921,328 | 5/1990 | Seth | 350/76.34 |
| 5,072,035 | 12/1991 | Chen et al. | 252/62.9 |
| 5,384,294 | 1/1995 | Teowee et al. | 252/62.9 PZ |
| 5,547,623 | 8/1996 | Barnard | 264/639 |
| 5,578,539 | 11/1996 | Glaubitt et al. | 106/134 |
| 5,656,073 | 8/1997 | Glaubitt et al. | 106/207.19 |

FOREIGN PATENT DOCUMENTS

| | | |
|---|---|---|
| 0 260 868 A2 | 3/1988 | European Pat. Off. . |
| G 83 08 852 | 3/1982 | Germany . |
| 43 32 831 C1 | 9/1993 | Germany . |

OTHER PUBLICATIONS

Selvaraj et al., J. Mat. Res., vol. 8 (4) pp. 992–996 (1992). No Month.
Klicker et al., J. Am. Cerm. Soc., vol. 64(1), 5–9 (1981). No Month.
Yoshikawa et al., Ferroelectrics, vol. 154, 325–330 (1994). No Month.
Shimono et al., Journal of the Ceramic Society of Japan, Int. edition vol. 101, 700–703 (1993). No Month.
Boulton et al., Mat. Res. Soc. Symp. Proc. vol. 271, pp. 517–523 (1992). No Month.
Waller et al., J. Am. Ceram. Soc 73 (11) 3503–506 (1990). No Month.

*Primary Examiner*—C. Melissa Koslow
*Attorney, Agent, or Firm*—Foley & Lardner

[57] ABSTRACT

A ceramic monofilament or multifilament fiber having a tensile strength of at least 100 mPa including $PbMO_{31}$, where M is a metallic element or a proportionate combination of various metallic elements which can occupy the "B" position in a perovskite lattice. Processes for producing the fiber are also provided. The fibers are useful as ferroelectric or piezoelectric fibers.

9 Claims, 3 Drawing Sheets

CERAMIC MONOFILAMENT OR MULTIFILAMENT FIBER AND PROCESSES FOR THEIR PRODUCTION AND USE

BACKGROUND OF THE INVENTION

1. Field of the Invention

The present invention relates to the field of ceramic fibers and in particular ceramic fibers having piezoelectric and/or ferroelectric properties, which can be produced in bundles by means of a sol-gel process, multifilament melt spinning, and subsequent pyrolysis. Of particular interest are fibers having diameters from the region which can no longer get into the lungs to about 100 μm, since a "quantum leap" in the piezoelectric properties of piezoelectric fiber composites produced from the fibers can be expected from a reduction of the diameter to those ranges mentioned.

Furthermore, the invention relates, in particular, to the production of very long, i.e., continuously produced, fibers having excellent tensile strengths which can be produced for the first time with the stated mechanical properties by means of the pseudo-continuous overall production process described below.

2. Description of Related Art

In the literature and patent literature, the production of polycrystalline, ceramic structural fibers has been followed and described since the beginning of the 1970s [see A. Borer et al.: U.S. Pat. No. 3,760,049; Sep. 18, 1973; H. G. Sowman: U.S. Pat. No. 3,795,524; Mar. 5, 1974; A. K. Dhingra, Phil. Trans. R. Soc. Lond. A 294, 411–417 (1980)].

Ferroelectric functional fibers such as the lead zirconate titanate (PZT) fiber have been reported only since the beginning of the 1990s [see V. K. Seth: U.S. Pat. No. 4,921,328; May 1, 1990; K. C. Chen et al.: U.S. Pat. No. 5,072,035; Dec. 10, 1991; U. Selvaraj et al.: J. Mat. Res., Vol. 7, No. 4, 992 (1992)]. The interest in thin PZT fibers goes back to the studies of R. E. Newnham, who was able to measure excellent piezoelectric properties for ultrasonic transducers and sonar equipment on PZT rods (400–840 μm in diameter) which were embedded in an aligned space in a polymer matrix [see R. E. Newnham et al.: J. Am. Ceram. Soc., Vol. 64, No. 1, 5–9 (1981)]. In this study, it was shown that the hydrostatic piezoelectric coefficient increases with decreasing rod diameters. However, the production method employed, viz. extrusion, is, like the "dice and fill" method employed today for commercially available ultrasonic transducers, restricted to the production of rods having a minimum diameter of about 100 μm.

In Ferroelectrics, Vol. 154, 325–330 (1994), S. Yoshikawa et al., describe the production of fibers having a pure perovskite structure and a diameter of 30 μm in the multifilament mode. The fibers were spun from a warmed sol and, after drawing, collected on a rotating drum. After cutting, 10 cm long individual fibers were heated at from 750 to 1250° C. for 10 minutes, giving fibers having tensile strengths of up to 55 mPa. Densities up to 90% were achieved. A disadvantage of the process is the uncontrollable rheological properties of the sol which is not stable and can only be spun within a very narrow temperature and time window. Furthermore, the fibers described by Yoshikawa et al., have to be densified at temperatures of >1200° C.

DE-C 43 32 831 C1 of the Fraunhofer-Gesellschaft also describes the production of PZT ceramic fibers with the aid of the sol-gel process by extrudation, with gel fibers having a length of up to 600 m being able to be obtained. These fibers were heated in the wound-up state to 660° C. over a period of one hour, giving PZT ceramic fibers having a diameter of 10 μm. The microstructure and the mechanical properties of the fibers thus produced are not satisfactory.

SUMMARY OF THE INVENTION

It is an object of the present invention to provide ceramic monofilament or multifilament fibers based on $PbMO_3$ which in the sintered state have not only excellent ferroelectric or piezoelectric properties, but also excellent mechanical properties.

A further object of the present invention is to provide processes which enable such improved fibers to be produced.

These objects are achieved in accordance with the present invention by providing a ceramic monofilament or multifilament fiber having a tensile strength of at least 100 mPa containing $PbMO_3$ optionally having a perovskite lattice, where M is a metallic element or a proportionate combination of various metallic elements which can occupy the "B" position in the perovskite lattice.

These objects are also achieved by providing a process for producing ceramic monofilament or multifilament fiber as described above, which include: (a) extruding a sol of organic metal compounds, optionally in combination with metal oxides, through one or more spinning orifices to form a fiber; (b) drying and winding up the fiber; and (c) continuously conveying the fiber or a bundle of the fibers through an elongated chamber of a pyrolysis furnace, wherein the fiber or the fiber bundle is exposed to a pyrolysis temperature which is sufficient to remove organic material, thereby forming the ceramic monofilament of multifilament fiber.

These objects are also achieved by providing a process for producing ceramic monofilament or multifilament fiber as described above, which includes: (a) extruding a sol of organic metal compounds, optionally in combination with metal oxides, through a plurality of spinning orifices to form a fiber; (b) drying and optionally winding up the fiber; and (c) heating one or more bundles of the fiber in an elongated chamber of a pyrolysis furnace by (i) lowering hanging one or more fiber bundles into the chamber or (ii) by heating up of a stationary fiber hanging into the chamber from above, where the one or more fiber bundle is exposed to a pyrolysis temperature which is sufficient to remove the organic material, thereby forming the ceramic monofilament or multifilament fiber.

There is also provided a process for producing ceramic piezoelectric and/or ferroelectric monofilament or multifilament fibers based on $PbMO_3$, comprising sintering ceramic monofilament or multifilament fibers produced as described above in an oxygen-containing atmosphere in the presence of a PbO partial pressure.

Further objects, features, and advantages of the present invention will become apparent from the detailed description of preferred embodiments that follows.

DETAILED DESCRIPTION OF THE PREFERRED EMBODIMENTS

Figure 1A:
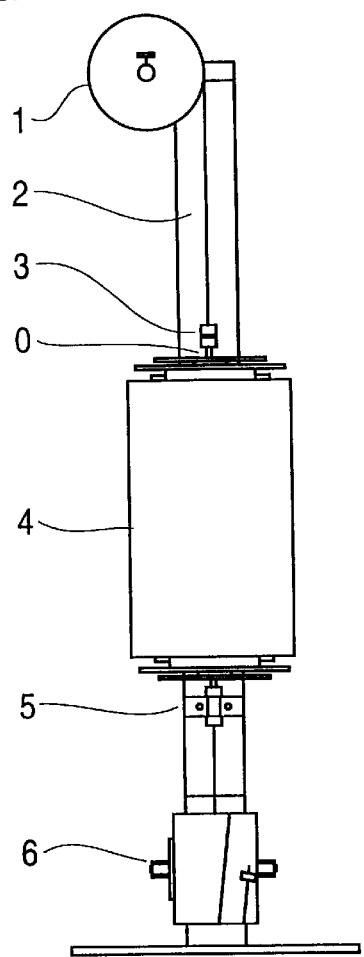
FIG. 1 shows a pyrolysis furnace useful in the present invention; (A is a side view and B is a front view)

All lead-containing compositions based on $PbMO_3$ which can be converted at least partially into the perovskite structure, i.e., the element "M" can occupy the "B" position in the perovskite lattice, are suitable for the present invention. Here, "based on" means that the compositions consist exclusively of, consist essentially of, or comprise substantial proportions of $PbMO_3$. Deviations from the exact stoichiometry are possible, for example as a result of an excess of lead oxide in the sol (and then in the fiber) or as a result of loss of lead oxide during sintering.

The composition can, alternatively or additionally, be doped by many different elements of which a few are listed below. It is also possible for the composition to contain such doping metals or their oxides in relatively large amounts, e.g., up to 5 or 10% by weight. Due to this and a possibly varying range of excess of PbO (see below), the $PbMO_3$ thus can constitute from about 80 to 100% by weight, but prefereably from 90 to 100% and most preferably from 90 to 95% by weight of the fiber. The element "M" in the "B" position can be a single metal or a combination of a plurality of metals, where the latter can have the same valence or else different valencies. Examples of M include tin, titanium, zirconium, hafnium, lanthanum, vanadium, niobium, magnesium, tantalum, tungsten, molybdenum, manganese, antimony, chromium, nickel, iron, zinc, scandium, silicon, germanium, tellurium, aluminum, and cobalt.

In particularly preferred systems, the "B" position is occupied by zirconium and titanium, possibly in addition by lanthanum and optionally tin; by magnesium and by niobium; by zinc, niobium and titanium; or by zirconium, titanium, niobium, and magnesium.

The system can be additionally doped, for example with one or more of the elements niobium, lanthanum, magnesium, scandium, tungsten, strontium, tin, barium, calcium, bismuth, antimony, tantalum, fluorine, and/or hafnium.

The gel fiber precursors for the fibers of the invention can be synthesized via a sol-gel route, for example as described in German Patent DE 43 32 831 (Glaubitt et al.), hereby incorporated by reference in its entirety. In this synthesis, the sol is produced by reacting alkoxides, possibly together with further alcohols, with carboxylic acids and lead carboxides, and the volatile constituents are removed. Lead and possibly a further element may be used in the form of an oxide. The starting compounds mentioned produce a liquid which can be converted by taking off volatile constituents into a clear, highly viscous liquid and possibly into a solid which contains organic components and is brittle and pulverizable at room temperature. This solid may be able to be converted back into a liquid by heating.

In a particular embodiment, the spinning sol is seeded with perovskite nuclei of the final chemical composition sought, for example in an amount of from 0.1 to 5% by mass.

If the sol is solid at room temperature, it is refluidized for spinning. In a preferred embodiment, the system lead-zirconium-titanium-oxygen, the sol which is solid at room temperature can be melted at from 110 to 150° C., preferably from 120 to 130° C. The liquid sol can be extruded through a die plate with holes. This can constitute the extrusion of monofilaments or multi-filaments having, for example, up to about 500 or even 5000 fibers and more. The diameter of the holes in the die plate is selected as a function of the desired diameter of the finished ceramic, possible piezoelectric and/or ferroelectric fiber and is, for example, from 0.1 to 1.0 mm, preferably 0.5 mm. Extrusion is preferably carried out at temperatures of from 100 to 180° C. at a pressure of, for example, from 0.11 mPa to 10 mPa.

The extruded fibers are conveyed through a drying section having a length of, for example, from 0.5 to 5 m and preferably from 1.0 to 2.0 m and are then taken up on a spool or the like and are drawn if required. In this procedure, the fiber diameter can be set by the winding speed or by the drawing step. Extrusion through holes having the abovementioned diameters enables the fiber diameter of the gel fibers to be set to a value in the range from 5 to 150 $\mu$m. For this purpose, the winding speed should be generally from 1 to 500 m/min, preferably from 20 to 150 m/min.

The separation of individual fibers can be achieved by means of a strip-like arrangement of the spinning orifices and can be aided by application of a solvent-permeable pyrolyizable size.

After spinning, the fibers are, taking into account the shrinkage on drying, wound off individually or in a bundle or even with the combining of a plurality of bundles having up to 2000 individual fibers and are pyrolyzed. In one embodiment, they can be conveyed continuously through a pyrolysis furnace.

Figure 1B:
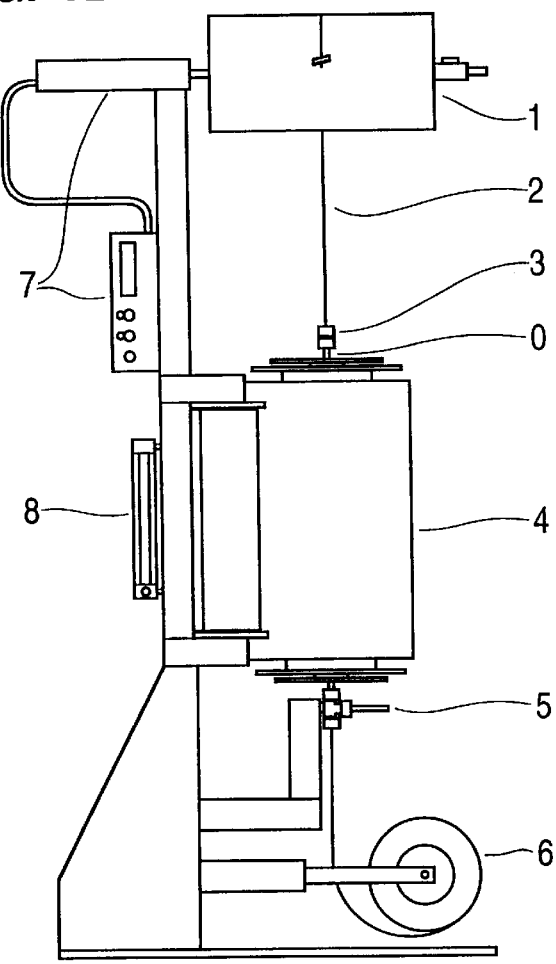

FIG. 1 shows, by way of example, a side (A) and front (B) views of such a pyrolysis furnace through which the gel fiber or the gel fiber bundle 2 is conveyed preferably from the bottom upward from the lower winding drum 6 to the upper winding drum 1. 4 is a pyrolysis furnace and 8 is a gas flow meter for measuring the gas flow. 3 is a fiber guide for guiding the fiber. The fiber or the fiber bundle here runs through a tube or a capillary or the like, for example of $Al_2O_3$ (in FIG. 1 denoted by 0). The internal diameter is selected in accordance with the number of filaments in the fiber bundle and can be, for example, an internal diameter of 5 mm at an external diameter of 8 mm, but can also be significantly larger. Since the fibers shrink in the axial direction by about 40% during pyrolysis, this has to be taken into account in the relative rotational speeds of the respective winding drums 1 and 6. The fiber transport speed depends on the material and on the pyrolysis temperature selected and can be, for example, in the range from 5 mm/h to 50 m/h. Preference is given to the embodiments depicted in FIG. 1 in which the upper winding drum is driven by the drive 7 while the winding drum 6 is moved passively.

This method enables the desired strength properties of the fibers to be achieved, among other things probably because the fibers are stretched by the tension applied by the winding drum 1.

Figure 3A:
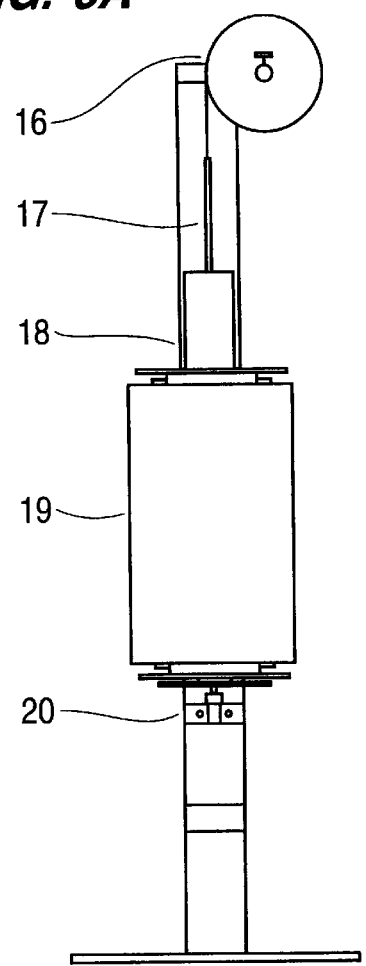
FIG. 3 shows a pyrolysis furnace useful in the present invention (A is a side view and B is a front view).
Figure 3B:
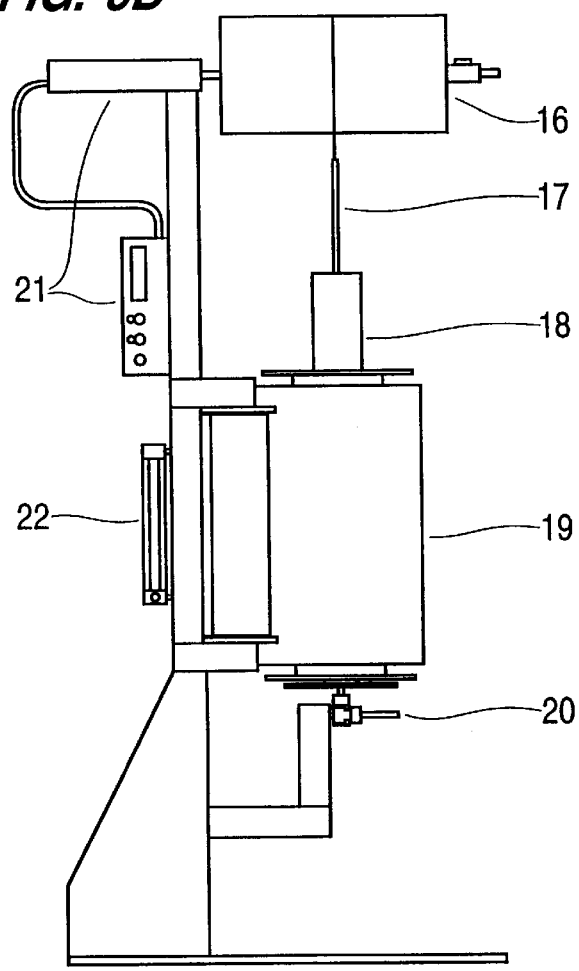

In an alternative embodiment which is particularly suitable for the simultaneous pyrolysis of a multiplicity of fibers which are not as long, the fibers are pyrolyzed batchwise. FIG. 3 shows, by way of example, side (A) and front (B) views of a corresponding pyrolysis furnace. In this embodiment, the force of gravity is utilized for achieving the desired mechanical properties by the fibers, preferably in a bundle 17 (or in a plurality of such bundles), preferably from a spool 16, either being slowly lowered into the chamber 18 of a previously heated pyrolysis furnace 19 or else by the chamber of the pyrolysis furnace into which the fibers hang from above being heated up with an appropriate temperature gradient. Here too, the fibers are under tension which at least contributes to the desired strength. Gas may be fed through gas feed line 20. Drive 21 drives winding drum 18. Gas flow meter 22 measures gas flow.

For this process variant, the fibers can be fixed, for example clamped or adhesively bonded to a suspension device.

In a preferred embodiment, likewise illustrated in FIG. 1, a continuous gas stream is passed at a flow rate of, for example, from 1 to 100 l/h (depending on the diameter of the pyrolysis tube) from the top or from the bottom through the pyrolysis tube. A nozzle 5 through which the gas stream is introduced into the pyrolysis tube can be seen in FIG. 1. Very particular preference is given to using nitrogen or a noble gas such as argon having an oxygen partial pressure of from $1 \times 10^{-6}$ to 0.05 mPa, very particularly from 5 Pa and 21 kPa. If the gas flow is in the same direction as the movement of the fibers, it supports the mechanically weak gel fiber whose organic constituents are first partially melted during pyrolysis before they are thermally decomposed. The danger of rupture of the fiber is greatly reduced in this way. Alternatively, the gas flow can also be in the opposite direction to the motion of the fibers. This has the likewise desired consequence that the pyrolysis gases are more quickly carried away. A person skilled in the art will be able to select the preferred variant on the basis of the strength of the respective gel fiber and the volatility of the pyrolysis gases. Particularly when using one of the above-mentioned gas mixtures, it is possible to obtain very long, crack-free ceramic fibers which after pyrolysis can either be wound up or directly transferred into a downstream sintering furnace.

Sintering is generally necessary if the ceramic fibers are to have optimum ferroelectric and/or piezoelectric properties.

The sintering of the ceramic fibers is preferably likewise carried out by continuously conveying the individual fiber or the multifilaments through a tube. According to the invention, it has been found that for this purpose temperatures in the range from 650 to 1400° C. are possible, but temperatures from 800 to 1000° C. are usually sufficient or preferred, in order to obtain a dense microstructure. The atmosphere in the furnace space itself is preferably stationary and has a PbO partial pressure. In an embodiment of the invention, the oxygen-containing sintering atmosphere has a PbO partial pressure from $10^{-30}$ to $10^5$ Pa. As a result of a constriction in the entry and exit regions, the tube is preferably a pseudo-closed zone.

Figure 2A:
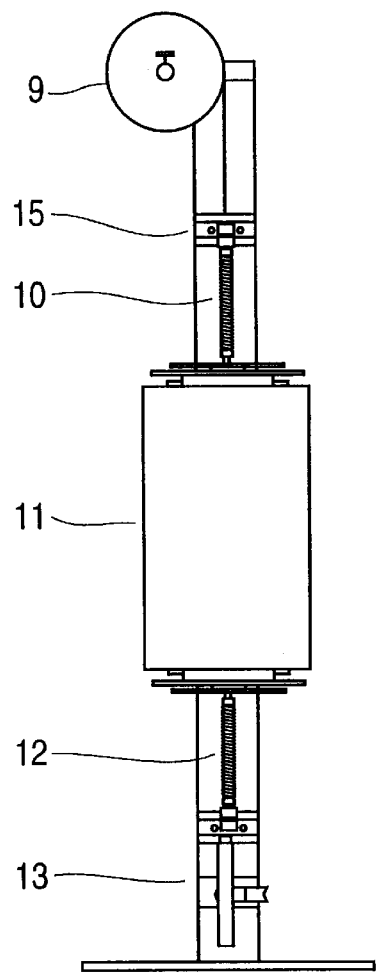
FIG. 2 shows a sintering furnace useful in the present invention; (A is a side view and B is a front view)
Figure 2B:
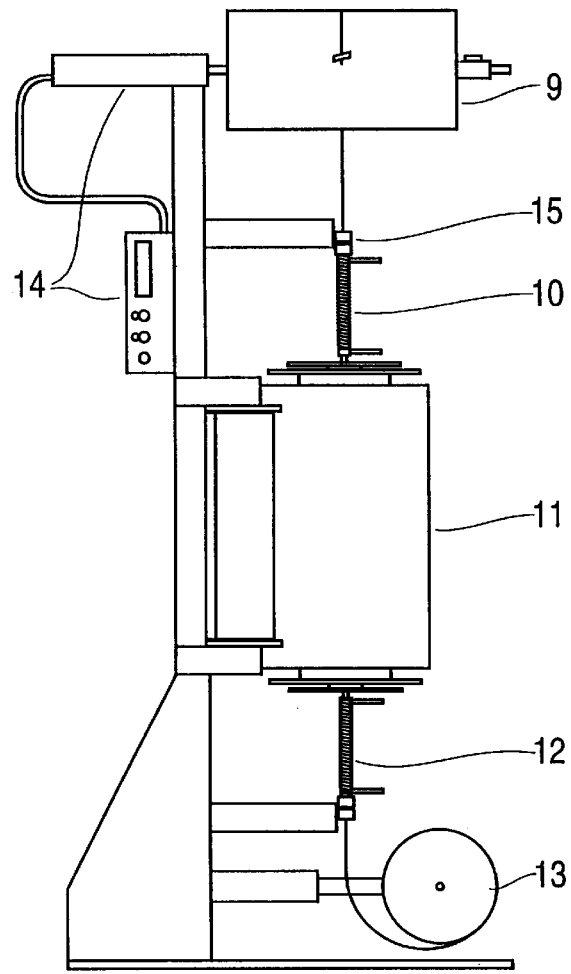

FIG. 2 schematically shows such a sintering furnace 11 from the side (A) and from the front (B). The constriction of the tube ends can be effected by bored Teflon stoppers 15 through which the fiber bundle is pulled. Cold traps for the condensation of gaseous PbO are preferably provided upstream and downstream of the furnace tube, which is depicted in FIG. 2 by the cooling coils 10 and 12. These can, for example, be made of copper. This prevents the exit of PbO vapor into the surroundings. The Pbo partial pressure can be achieved, for example, by mixing the corresponding amount of gaseous PbO into the furnace atmosphere. PbO depletion of the atmosphere by condensation can be compensated by a PbO excess of, for example, from 0.1 to 15 mol % in the fiber composition. In addition or alternatively, a PbO-containing coating can be applied to the inside of the furnace chamber. With introduction of sufficient PbO from the fiber or the inner lining of the furnace chamber, a sufficient equilibrium PbO partial pressure may be formed in the sintering atmosphere, so that introduction of gaseous PbO into the furnace space can be omitted. Winding drum 9 and winding spool 13 are used to wind the fiber. Drive 14 drives winding drum 9.

In the case of a coupled pyrolysis-sintering arrangement (continuous pyrolysis as shown in FIG. 1), the fiber transport speed is determined by the pyrolysis rate.

The fiber diameters obtained after sintering are generally from 3 to 100 $\mu$m, preferably from 5 to 30 $\mu$m, for gel fibers extruded through holes of 0.1 to 1.0 mm. A fine adjustment can be achieved, as already mentioned above, by drawing.

The microstructural development (size, morphology) of the fibers can be altered by changing the PbO content and/or doping with elements such as La, Nb, Mg, Sn, etc., and also by changing the sintering temperature and/or the sintering time. The grain sizes are usually in the range from 0.1 $\mu$m to 1000 $\mu$m, preferably from 0.3 to 10 $\mu$m. After sintering for 5 hours at 850° C. in a PbO-containing air atmosphere, the mean grain size is, for example, 1.8 $\mu$m.

Both the pyrolysis furnace and the sintering furnace can be heated by induction, resistance, or microwave heating. The length of the firing chamber is variable and can be, for example, from 20 cm to 10 m, depending on the circumstances. Pyrolysis can occur at a temperature of up to 700° C., for example in a temperature range of 450° to 700° C., or 500° to 700° C., or 550° to 700° C., or 600° to 700° C. In an embodiment of the invention, the pyrolysis is carried out at a temperature of up to about 700° C. and (i) the speed at which the fibers are lowered is in the range from 5 mm/h to 50 m/h or (ii) the rate at which the fiber bundle is heated is from 5 K/h to 100 K/min. In the process, gas can be passed through the elongated chamber of the pyrolysis furnace; (i) the volume flow of the gas can be from 1 to 100 l/h or (ii) the gas can comprise nitrogen with an oxygen partial pressure in the range from about $1 \times 10^{-6}$ to 0.05 mPa.

After pyrolysis and sintering, the fibers obtained by the process of the invention have surprisingly high tensile strengths of greater than 100 mPa, for example in the range from >100 mPa to about 300 mPa, or from >100 to 200 mPa, or generally from >100 to 150 mPa which are far above those of the fibers which have been pyrolyzed and sintered batchwise resting on a support.

In an optional coating step following sintering, a thermoplastic or thermoset polymer layer having a thickness of from 1 to 200% of the fiber diameter can be applied to the fiber surface by continuous wetting of the fiber bundle or the separated individual fibers.

If the spinning sol is seeded with perovskite nuclei which have an elongated habit along crystallographically preferred axes and have a high electromechanical coupling factor, these are aligned along the gel fiber axis by the spinning process. As a result of heterogeneous nucleation and/or temperature gradients during the continuous pyrolysis and sintering, crystal growth and orientation of the originally randomly oriented crystallites by epitactic growth on the introduced nuclei can lead to extended, fibrous, single-crystal regions having the desired crystallographic orientation.

The invention is illustrated and further explained below by means of a number of examples. The examples are for illustrative purposes and do not limit the scope of the invention.

EXAMPLE 1

A hydrolyzed and condensed sol of the composition 1/3 Pb(OAc)$_2$. 2/3 PbO. ZrO$_{0.53}$Ti$_{0.47}$O$_{0.6}$(OH)$_{1.2}$(OOCEt)$_{1.6}$ is extruded at 125° C. and a pressure of 1.5 mPa through a five-hole die plate in which the holes each have a diameter of 500 $\mu$m. After a 1.8 m long drying zone, the fibers are taken up on a rotating drum at a speed of 50 m/min and drawn to a fiber diameter of about 50 $\mu$m. The freshly spun gel fibers are dried at room temperature and about 50% atmospheric humidity for 24 hours on the takeup spool at a reduced spool radius (to make shrinkage of the fibers possible).

The fiber spool is then installed under the pyrolysis furnace and the start of the fiber bundle is threaded through the furnace and fixed to the upper spool. After heating the furnace to 600° C. at 1.5 K/min, the gel fiber bundle is pulled through the furnace at a speed of the upper spool of 15 mm/h. Owing to the longitudinal fiber shrinkage of 40%, the lower spool has a speed of about 25 mm/h. The fiber transport is aided by a nitrogen flow of 9 l/h. The oxygen content of the nitrogen transport gas is 450 vpm. The sintering step which follows pyrolysis is carried out at a temperature of 900° C. and a constant fiber transport speed of 40 mm/h. After sintering, the individual fibers of the bundle have a diameter of about 30 $\mu$m. The density of the ceramic is greater than 98% and the grain sizes are from 2 to 4 $\mu$m. Chemical analysis, X-ray analysis and EDAX verify the desired stoichiometry of $Pb(Zr_{0.53}Ti_{0.47})O_3$.

EXAMPLE 2

A sol having the composition as in Example 1 with addition of 0.012 mol of niobium ethoxylate and 0.012 mol of dissolved MgO is spun at a temperature of 130° C. and a pressure of 1.0 mPa in the 15 filament mode and after a 1.2 m long drying zone is drawn at 120 m/min to a diameter of about 15 $\mu$m and wound up. Under the pyrolysis conditions of Example 1, sintering at 950° C. at a fiber transport speed of 55 mm/h leads to ceramic fibers of almost full density (>95%) having the composition $Pb(Zr_{0.53}Ti_{0.446}Nb_{0.012}Mg_{0.012})O_3$ and an individual fiber diameter of about 9 $\mu$m. The fibers leaving the sintering furnace are separated by a comb which is wetted with a continuously mixed epoxy resin/hardener mixture. In this way, the individual fibers are provided with an epoxy resin coating. In a subsequent step, the fiber coatings are thermally cured at 130° C. before the fibers are again combined into a bundle.

Continuous ceramic fibers in bundles of up to 500 and more monofilaments made from gel fiber multifilaments derived from a sol-gel can thus be produced by continuous pyrolysis and converted by sintering into the desired crystal structure having the desired electrical properties. They preferably have fiber diameters of from 3 to 100 $\mu$m and a polycrystalline microstructure after sintering having grain sizes of from 0.1 to 1000 $\mu$m. The grains can be oriented in preferred crystallographic directions by nucleation and controlled crystal growth.

The process for converting the gel fibers into ceramic fibers comprises continuous pyrolysis of the fibers at temperatures up to about 700° C. in a run-through furnace through which, preferably, an $N_2$ gas stream having a defined oxygen partial pressure, very particularly preferably of from $5 \times 10^{-6}$ to 0.021 mPa, and a volume flow of preferably from 1 to 100 l/h is passed in the same or opposite direction to the fibers. In a second thermal treatment step which can take place in a run-through sintering furnace arranged in series above or below the pyrolysis furnace, the fibers can be sintered under PbO partial pressure control in oxygen-containing atmospheres, preferably in air, at temperatures of up to 1400° C., preferably up to 1000° C.

German Application 196 35748.9, filed Sep. 3, 1996 (the priority application of the instant application) is hereby incorporated by reference in its entirety.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A process for producing ceramic monofilament or multifilament fiber having a tensile strength of at least 100 mPa comprising $PbMO_3$, where M is a metallic element or a proportionate combination of metallic elements which can occupy the "B" position in a perovskite lattice, which comprises:

(a) extruding a sol of organic metal compounds, optionally in combination with metal oxides, through one or more spinning orifices to form a fiber,
    (b) drying and winding up the fiber, and
    (c) continuously vertically drawing the fiber or a bundle of the fibers through an elongated chamber of a pyrolysis furnace in an upward direction, wherein the fiber or the fiber bundle is exposed to a pyrolysis temperature which is sufficient to remove organic material, thereby forming the ceramic monofilament or multifilament fiber.

2. A process as claimed in claim 1, wherein the pyrolysis is carried out at a temperature of up to about 700° C. and the speed at which the monofilament or multifilament fibers run through the pyrolysis furnace is in the range from 5 mm/h to 50 m/h.

3. A process as claimed in claim 1, wherein during pyrolysis a gas is passed through the elongated chamber in the same direction as or the opposite direction to the direction the fibers are conveyed.

4. A process for producing a ceramic piezoelectric or ferroelectric monofilament or multifilament fiber comprising $PbMO_3$, comprising (a) extruding a sol of organic metal compounds, optionally in combination with metal oxides, through one or more spinning orifices to form a fiber,
    (b) drying and winding up the fiber, and
    (c) continuously vertically drawing the fiber or a bundle of the fibers through an elongated chamber of a pyrolysis furnace in an upward direction, wherein the fiber or the fiber bundle is exposed to a pyrolysis temperature which is sufficient to remove organic material, thereby forming a ceramic monofilament or multifilament, and sintering the ceramic monofilament or multifilament fiber in an oxygen-containing atmosphere in the presence of a PbO partial pressure.

5. A process as claimed in claim 4, wherein the sintering comprises conveying the ceramic monofilament or multifilament fiber continuously through an elongated chamber of a sintering furnace heated to from about 800 to 1000° C.

6. A process as claimed in claim 4, wherein the oxygen-containing sintering atmosphere has a PbO partial pressure of from $10^{-30}$ to $10^5$ Pa.

7. The process as claimed in claim 4, wherein the oxygen-containing sintering atmosphere is enriched with PbO to give a partial pressure by (I) a PbO-containing coating on an inner wall of a furnace chamber wherein the sintering occurs or (II) by volatilization of excess PbO from the fiber.

8. A process as claimed in claims 4, wherein the sintering comprises sintering the fiber in a stationary atmosphere in a psuesdo-closed sintering zone.

9. A process for producing ceramic monofilament or multifilament fiber having a tensile strength of at least 100 mPa comprising $PbMO_3$, where M is a metallic element or a proportionate combination of metallic elements which can occupy the "B" position in a perovskite lattice, which comprises:

(a) extruding a sol of organic metal compounds, optionally in combination with metal oxides, through one or more spinning orifices to form a fiber; adding from 0.1 to 5% by mass of perovskite nuclei of the corresponding composition $PbMO_3$ which have an elongated habit along crystallographically preferred axes to the sol of step (a), (b) drying and winding up the fiber, and (c) continuously conveying the fiber or a bundle of the fibers through an elongated chamber of a pyrolysis furnace, wherein the fiber or the fiber bundle is exposed to a pyrolysis temperature which is sufficient to remove organic material, thereby forming the ceramic monofilament or multifilament fiber.

* * * * *